(12) United States Patent
Lee et al.

(10) Patent No.: US 10,079,366 B2
(45) Date of Patent: Sep. 18, 2018

(54) PLASTIC ORGANIC ELECTROLUMINESCENT DISPLAY DEVICE AND METHOD OF FABRICATING THE SAME

(75) Inventors: Jae-Young Lee, Daejeon (KR); Won-Jae Yang, Paju-si (KR); Myung-Seop Kim, Goyang-si (KR); Tae-Kyung Kim, Yeosu-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 13/311,857

(22) Filed: Dec. 6, 2011

(65) Prior Publication Data
US 2012/0319572 A1    Dec. 20, 2012

(30) Foreign Application Priority Data

Jun. 14, 2011    (KR) .................... 10-2011-0057303

(51) Int. Cl.
*H01L 51/52* (2006.01)

(52) U.S. Cl.
CPC ........ *H01L 51/5281* (2013.01); *H01L 51/524* (2013.01); *H01L 2251/5338* (2013.01)

(58) Field of Classification Search
CPC ......... H01L 2251/5338; H01L 51/5256; H01L 51/5253; H01L 51/524; H01L 51/5281; G02B 1/111; G02B 1/113
USPC ..... 313/498–512; 315/169.3; 345/36, 45, 76
See application file for complete search history.

(56) References Cited

U.S. PATENT DOCUMENTS

| 6,146,225 A * | 11/2000 | Sheats ................ H01L 51/5256 445/24 |
| 2002/0140890 A1 * | 10/2002 | Hanada ................ G02F 1/1333 349/122 |
| 2003/0203235 A1 | 10/2003 | Ishii et al. |
| 2004/0005482 A1 * | 1/2004 | Kobayashi et al. .......... 428/702 |
| 2004/0051445 A1 | 3/2004 | Adachi |
| 2004/0252358 A1 * | 12/2004 | Kawahara ................ G02F 1/19 359/272 |

(Continued)

FOREIGN PATENT DOCUMENTS

| CN | 1463367 A | 12/2003 |
| CN | 1665361 A | 9/2005 |

(Continued)

OTHER PUBLICATIONS

Office Action issued in counterpart Korean Patent Application No. 10-2011-0057303 dated Mar. 19, 2013.

(Continued)

*Primary Examiner* — Christopher Raabe
(74) *Attorney, Agent, or Firm* — Morgan, Lewis & Bockius LLP (57) ABSTRACT

Disclosed are a plastic organic electroluminescent display device to realize flexibility and prevent visualization of exterior light and a method for fabricating the same. The plastic organic electroluminescent display device includes a light emitting cell including a first electrode, a light emitting organic layer and a second electrode arranged on a substrate in this order, a barrier film adhered to the substrate provided with the light emitting cell, to seal the light emitting cell, the barrier film including an optically isotropic support film, and a circular polarizer adhered onto the optically isotropic barrier film.

20 Claims, 8 Drawing Sheets

(56) References Cited

U.S. PATENT DOCUMENTS

| | | |
|---|---|---|
| 2005/0035353 A1* | 2/2005 | Adachi et al. ............... 257/72 |
| 2005/0194896 A1* | 9/2005 | Sugita et al. ............... 313/506 |
| 2007/0224368 A1 | 9/2007 | Hara et al. |
| 2008/0033112 A1* | 2/2008 | Squire et al. ............... 525/240 |
| 2008/0048558 A1 | 2/2008 | Song et al. |
| 2009/0051277 A1 | 2/2009 | Inoue et al. |
| 2009/0153783 A1 | 6/2009 | Umemoto |
| 2009/0168169 A1 | 7/2009 | Jeong et al. |
| 2009/0278449 A1 | 11/2009 | Choi et al. |
| 2010/0066970 A1* | 3/2010 | Miyazaki ............ G06K 19/077 349/158 |
| 2010/0073936 A1* | 3/2010 | Padiyath et al. ......... 362/311.14 |
| 2010/0327737 A1* | 12/2010 | Hayashi et al. ............... 313/504 |

FOREIGN PATENT DOCUMENTS

| | | |
|---|---|---|
| CN | 1968807 A | 5/2007 |
| CN | 101577289 A | 11/2009 |
| CN | 101930701 A | 12/2010 |
| DE | 100 35 606 C2 | 5/2001 |
| DE | 103 13 805 B4 | 8/2005 |
| DE | 10 2006 009 217 A1 | 8/2007 |
| EP | 1 380 857 A1 | 1/2002 |
| EP | 1 424 739 A2 | 6/2004 |
| EP | 1 826 821 A2 | 8/2007 |
| JP | 2002-156524 A | 5/2002 |
| KR | 10-2000-0066059 A | 11/2000 |
| KR | 10-2008-0006922 A | 1/2008 |
| KR | 10-2010-0063292 A | 6/2010 |
| KR | 10-2010-0070795 A | 6/2010 |
| WO | 2011/118661 A1 | 9/2001 |
| WO | 2007/088954 A1 | 8/2007 |
| WO | 2009/028356 A1 | 3/2009 |
| WO | 2011/030883 A1 | 3/2011 |

OTHER PUBLICATIONS

UK Search Report issued in corresponding UK Patent Application 1120931.9 dated Apr. 2, 2012.

The First Office Action dated Aug. 19, 2014 from the State Intellectual Property Office of the People's Republic of China in counterpart Chinese Patent Application No. 201110424111.1.

Chinese Office Action issued in Chinese Patent Application No. 201110424111.1 dated Mar. 6, 2015.

German Office Action issued in German Patent Application No. 10 2011 056 184.6 dated Sep. 2, 2016.

\* cited by examiner

| | PES | PET | COC |
|---|---|---|---|
| RETARDATION VALUE | 13 | 68 | 3 |
| EXTERIOR VISIBILITY | | | |

PLASTIC ORGANIC ELECTROLUMINESCENT DISPLAY DEVICE AND METHOD OF FABRICATING THE SAME

This application claims the benefit of Korean Patent Application No. 10-2011-57303, filed on Jun. 14, 2011, which is hereby incorporated by reference as if fully set forth herein.

BACKGROUND OF THE INVENTION

Field of the Invention

The present invention relates to a plastic organic electroluminescent display device to realize flexibility and prevent visualization of exterior light and a method for fabricating the same.

Discussion of the Related Art

Conventional organic electroluminescent display panels are self-luminous and thus do not require a backlight, thus realizing light weight and slimness, being manufactured in a simple process, and being suitable for next-generation flat panel displays due to superior properties such as large viewing angle, rapid response and high contrast ratio).

In particular, holes generated from an anode are combined with electrons generated from a cathode in a light emitting organic layer to produce excitons and the excitons return to a ground state, thus releasing energy. Organic electroluminescent display panels emit light based on this energy.

The organic light emitting layer of the organic electroluminescent display panel is protected using a sealing cap formed of glass since it is vulnerable to moisture and oxygen. However, disadvantageously, conventional organic electroluminescent display panels cannot realize flexibility due to the sealing cap formed of a glass. In addition, the organic electroluminescent display panel has a disadvantage in that incident exterior light is reflected from an anode or cathode, and is emitted outside and is then visualized.

SUMMARY OF THE INVENTION

Accordingly, the present invention is directed to a plastic organic electroluminescent display device and a method for fabricating the same that substantially obviate one or more problems due to limitations and disadvantages of the related art.

It is one object of the present invention to provide a plastic organic electroluminescent display device to realize flexibility and prevent visualization of exterior light and a method for fabricating the same.

To achieve these objects and other advantages and in accordance with the purpose of the invention, as embodied and broadly described herein, provided is a plastic organic electroluminescent display device including: a light emitting cell including a first electrode, a light emitting organic layer and a second electrode arranged on a substrate in this order; a barrier film adhered to the substrate provided with the light emitting cell, to seal the light emitting cell, the barrier film including an optically isotropic support film; and a circular polarizer adhered onto the optically isotropic barrier film.

The barrier film may include: the optically isotropic support film; a barrier layer having a multilayer structure, arranged on at least one of the front surface and the rear surface of the optically isotropic support film; a lower adhesive adhered to the substrate provided with the light emitting cell; and an upper adhesive adhered to the circular polarizer.

The optically isotropic support film may be formed of triacetylcellulose (TAC), a cyclic olefin copolymer (COC), a cyclic olefin polymer (COP), or a mixture of at least one of a cyclic olefin copolymer (COC) and cyclic olefin polymer (COP), and a glass fiber.

The optically isotropic support film may have a retardation of 0 to 5 nm.

In another embodiment, the device may further include: a barrier protective film having a monolayer structure interposed between the barrier film and the second electrode, wherein the barrier protective film is formed of aluminum oxide ($Al_xO_y$), silicon oxynitride ($SiON_x$), silicon oxide ($SiO_x$) or silicon nitride ($SiN_x$).

In another embodiment, the device may further include: a barrier protective film having a multilayer structure, arranged between the barrier film and the second electrode, wherein the barrier protective film has a structure in which an organic barrier protective film formed of a polymer material such as an acrylic resin, an epoxy resin, polyimide or polyethylene, and an inorganic barrier protective film formed of aluminum oxide ($Al_xO^y$), silicon oxynitride ($SiON_x$), silicon oxide ($SiO_x$) or silicon nitride ($SiN_x$) are alternately laminated at least once.

In accordance with another aspect, provided is a method for manufacturing a plastic organic electroluminescent display panel including: sequentially forming a first electrode, a light emitting organic layer and a second electrode on a substrate to form a light emitting cell; adhering a barrier film having an optically isotropic support film to the substrate provided with the light emitting cell to seal the light emitting cell; and adhering a circular polarizer to the optically isotropic barrier film.

The adhering the barrier film may be carried out by adhering a barrier film including the optically isotropic support film processed by a non-stretching extrusion method or a non-stretching casting method, a barrier layer having a multilayer structure arranged on at least one of the front surface and the rear surface of the optically isotropic support film, a lower adhesive adhered to the substrate provided with the light emitting cell, and an upper adhesive adhered to the circular polarizer, to the substrate provided with the light emitting cell through a thermal lamination process.

In another embodiment, the method may further include: forming a barrier protective film having a monolayer structure interposed between the barrier film and the second electrode, wherein the barrier protective film is formed of aluminum oxide ($Al_xO_y$), silicon oxynitride ($SiON_x$), silicon oxide ($SiO_x$) or silicon nitride ($SiN_x$).

In another embodiment, the device may further include: forming a barrier protective film having a multilayer structure, arranged between the barrier film and the second electrode, wherein the barrier protective film is formed by alternately laminating, at least once, an organic barrier protective film formed of a polymer material such as an acrylic resin, an epoxy resin, polyimide or polyethylene, and an inorganic barrier protective film formed of aluminum oxide ($Al_xO_y$), silicon oxynitride ($SiON_x$), silicon oxide ($SiO_x$) or silicon nitride ($SiN_x$).

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and along with the description serve to explain the principle of the invention. In the drawings.

DETAILED DESCRIPTION OF THE INVENTION

Preferred embodiments of the present invention will be more clearly understood from the following detailed description taken in conjunction with the accompanying drawings.

Figure 1:
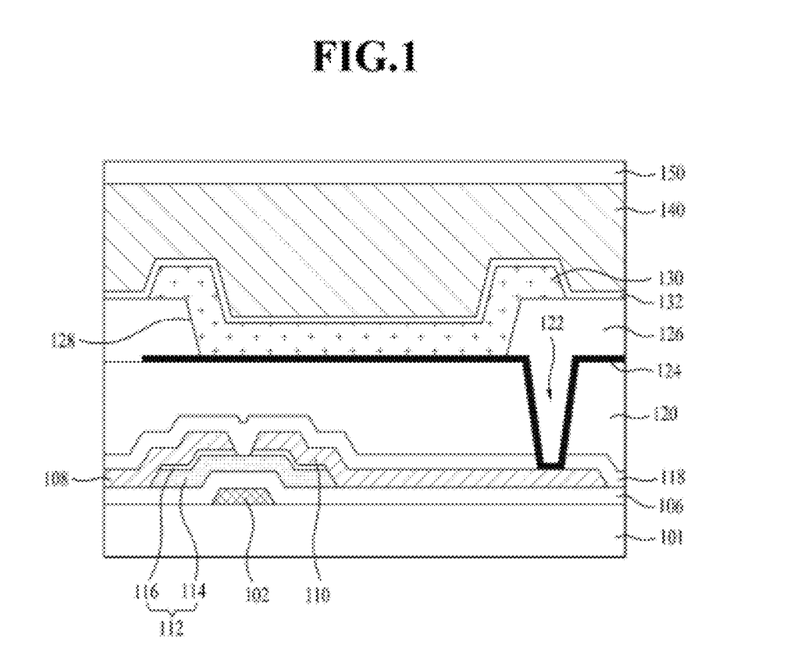
FIG. 1 is a cross-sectional view illustrating an organic electroluminescent display panel according to one embodiment of the present invention.

FIG. 1 is a cross-sectional view illustrating an organic electroluminescent display panel according to one embodiment of the present invention.

The organic electroluminescent display panel shown in FIG. 1 includes a substrate 101 provided with a driving thin film transistor and a light emitting cell; a barrier film 140 adhered to the substrate 101 provided with the light emitting cell and the driving thin film transistor; and a circular polarizer 150 adhered to the barrier film 140.

The driving thin film transistor includes: a gate electrode 102 formed on the substrate 101 formed of glass or plastic; a drain electrode 110 which contacts the first electrode 124 of the light emitting cell; a source electrode 108 which faces the drain electrode 110; an active layer 114 which overlaps the gate electrode 102 with the gate insulating film 106 therebetween to form a channel part between the source electrode 108 and the drain electrode 110; and an ohmic contact layer 116 formed on the active layer excluding the channel part to realize ohmic contact between the source electrode 108 and the drain electrode 110. In addition, an inorganic protective film 118 formed of an inorganic insulating material and an organic protective film 120 formed of an organic insulating material may be formed in this order on the driving thin film transistor formed on the substrate 101. The organic protective film 120 is formed to planarize the substrate 101 provided with the driving thin film transistor and the inorganic protective film 118 is formed to improve interface stability between each of the gate insulating film 106, and the source and drain electrodes 108 and 110, and the organic protective film 120.

The light emitting cell includes the first electrode 124 formed on the organic protective film 120, a light emitting organic layer 130 including a light emitting layer formed on the first electrode 124 and a second electrode 132 formed on the light emitting organic layer 130.

The light emitting organic layer 130 includes hole-related layers, a light emitting layer and electron-related layers laminated on the first electrode 124 in this order or in reverse order.

The first electrode 124 is electrically connected to the drain electrode 110 of the driving thin film transistor through a pixel contact hole 122 which passes through the inorganic protective film 118 and the organic protective film 120. The first electrode 124 is formed of a highly reflective and non-transparent conductive material such as aluminum (Al).

The bank insulating film 124 is formed in a region excluding the light emitting region.

As a result, the bank insulating film 124 includes a bank hole 128 to expose the first electrode 122 corresponding to the light emitting region.

The second electrode 132 is formed on the light emitting organic layer 130. The second electrode 132 is formed of a transparent and conductive material such as ITO to discharge light generated from the light emitting organic layer 130 through the second electrode 132 to the outside. The second electrode 132 may be formed to a thickness, allowing the non-transparent conductive material such as Mg:Ag or Al to transmit light.

The barrier film 140 is formed on the substrate 101 provided with the light emitting cell to cover the light emitting cell. The barrier film 140 is not directly formed on the substrate 101 provided with the light emitting cell but is separately formed and is then adhered to the substrate 101 provided with the light emitting cell through an adhesive. As such, when the barrier film 140 is used as a sealing cap, it should have an ambient contrast ratio of 6 or more at 5,000 Lux.

Figure 2A:
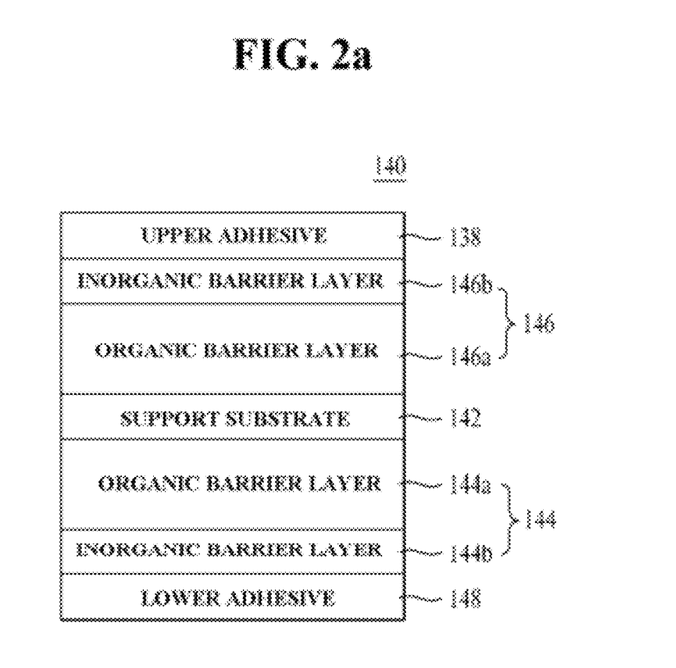
FIGS. 2A to 2C are sectional views illustrating barrier films of FIG. 1 according to embodiments of the present invention.
Figure 2B:
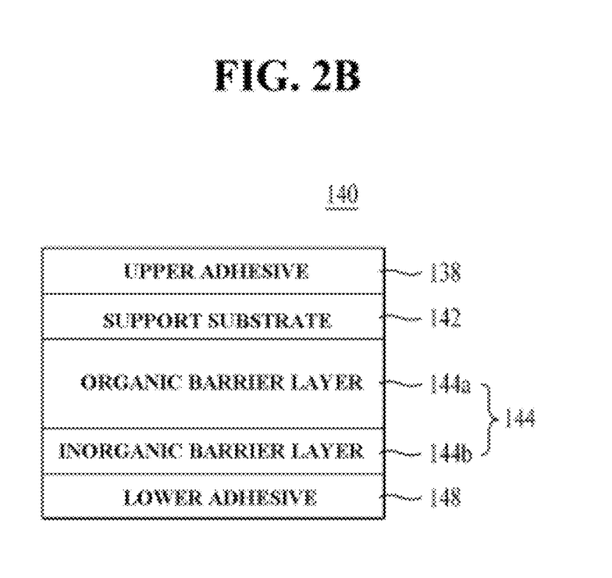
Figure 2C:
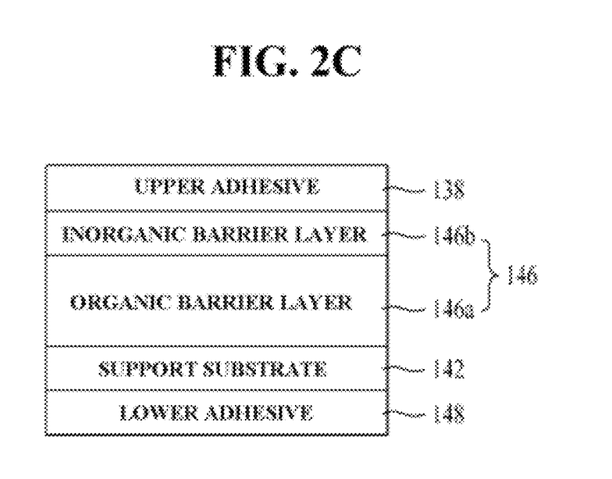

The barrier film 140 blocks permeation of moisture or oxygen into the light emitting cell. For this purpose, as shown in FIG. 2A, the barrier film 140 includes a support film 142, an upper barrier layer 146 arranged on the front surface of the support film 142, a lower barrier layer 144 arranged on the rear surface of the support film 142, an upper adhesive 138 arranged on the front surface of the upper barrier layer 146, and a lower adhesive 148 arranged on the rear surface of the lower barrier layer 144. Meanwhile, as shown in FIGS. 2B and 2C, either the upper barrier layer 146 or the lower barrier layer 144 may be formed on one surface of the support film 142.

The upper adhesive 138 is formed of a natural-setting adhesive (pressure sensitive adhesive, PSA), and adheres the circular polarizer 150 to the barrier film 140.

The lower adhesive 148 is formed of a thermosetting or natural-setting epoxy-based adhesive. The lower adhesive 148 adheres the barrier film 140 to the substrate 101 provided with the light emitting cell.

Meanwhile, when the upper adhesive 138 and the lower adhesive 148 are formed using a photosetting adhesive, the light emitting organic layer 130 is damaged by light used during the curing process. For this reason, the upper adhesive 138 and the lower adhesive 148 are a thermosetting or natural-setting type adhesive.

The upper barrier layer 146 and the lower barrier layer 144 include at least one of the organic barrier layers 146a and 144a and at least one of the inorganic barrier layers 146b and 144b, respectively. For example, each of the upper barrier layer 146 and the lower barrier layer 144 has a multilayer structure in which the organic barrier layer 146a or 144a and the inorganic barrier layer 146b or 144b are alternately formed at least once.

The inorganic barrier layer 146b or 144b is formed on the organic barrier layer 146a or 144a to primarily block permeation of exterior moisture or oxygen. The inorganic barrier layer 146b or 144b is formed of aluminum oxide ($Al_xO_y$), silicon oxide ($SiO_x$) or silicon nitride ($SiO_y$).

The organic barrier layer 146a or 144a is formed at one or both surfaces of the support film 142 to secondarily block permeation of moisture or oxygen. In addition, the organic barrier layer 146a or 144a compensates for stress between other layers caused by bending of the organic light emitting display panel and enhances evenness. These barrier layers 146a and 144a are formed of a polymer material such as an acrylic resin, an epoxy resin, polyimide or polyethylene.

The support film 142 is optically isotropic and transmits light incident upon the barrier film 140 without any retardation. Accordingly, reflection of exterior light can be blocked by the circular polarizer 150 arranged on the barrier film 140 and visualization of exterior light can thus be prevented.

As such, the support film 142 is formed such that it has a retardation of 0 to 5 nm so that the support film 142 is optically isotropic. To achieve this, the support film 142 is formed of triacetylcellulose (TAC), a cyclic olefin copolymer (COC), a cyclic olefin polymer (COP), or a mixture of at least one of a cyclic olefin copolymer (COC) and cyclic olefin polymer (COP), and a glass fiber. In particular, the support film 142 containing a glass fiber has a similar coefficient of thermal expansion to that of the substrate 101 provided with the light emitting cell and thus prevents distortion of organic electroluminescent display panels due to difference in coefficient of thermal expansion. Meanwhile, when the support film 142 does not contain glass fiber, distortion of organic electroluminescent display panels caused by difference in coefficient of thermal expansion can be prevented by removing the substrate 101 arranged under the light emitting cell using a laser for slimness after completing the organic electroluminescent display panel.

Meanwhile, the support film having a retardation higher than 5 nm is optically isotropic and light incident upon the barrier film is thus retarded. Accordingly, exterior light is reflected, instead of being polarized, by the optically isotropic support film, is discharged through the organic electroluminescent display panel to the outside and is visualized.

Figure 3:
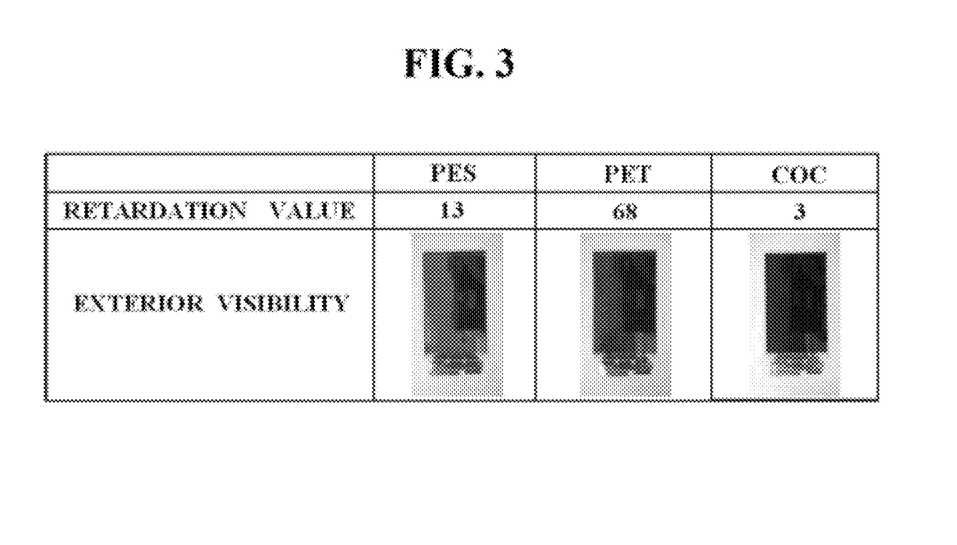
FIG. 3 is a view showing illustrating exterior visibility according to retardation values of the support film shown in FIGS. 2A to 2C.

Specifically, as shown in FIG. 3, since the support film 142 formed of polyether sulfone (PES) having a retardation of 13 nm and polyethylene terephthalate (PET) having a retardation of 68 nm is optically isotropic, exterior light is not polarized by the circular polarizer 150 and is reflected and visualized. On the other hand, the support film 142 formed of a cyclic olefin copolymer (COC) having a retardation of 3 nm is optically isotropic. Accordingly, reflection of exterior light can be blocked by the circular polarizer 150 arranged on the barrier film 140 and visualization of exterior light can thus be prevented.

Figure 4:
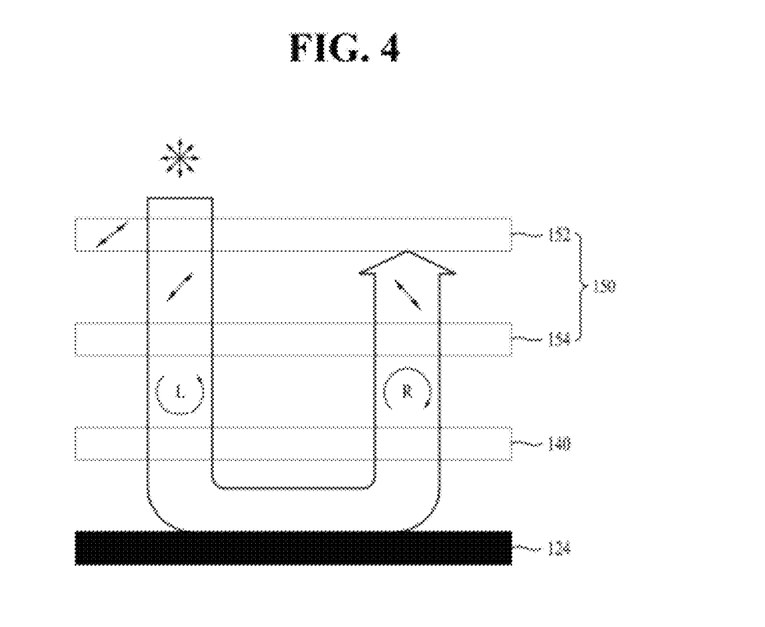
FIG. 4 is a sectional view illustrating a process in which reflection of exterior light is blocked using the circular polarizer shown in FIG. 1.

The circular polarizer 150 transmits light generated from the light emitting organic layer 130 and blocks exterior light generated from the non-transparent first electrode 124 to improve the contrast of the organic electroluminescent display panel. As shown in FIG. 4, the circular polarizer 150 includes a retardation film 154 and a linear polarizer 152 arranged on the retardation film 154.

The linear polarizer 152 polarizes exterior light incident from the outside and blocks exterior light reflected from the first electrode 124.

The retardation film 154 has a central axis which forms an angle of 45 degrees with a central axis of the linear polarizer 152 to retard exterior light passing through the linear polarizer 152 at λ/4.

A process in which the circular polarizer 150 blocks, instead of reflecting, exterior light will be described with reference to FIG. 4.

Exterior light incident from the outside of the circular polarizer 150 is converted into linearly polarized light parallel to the linear polarizer 152 through the linear polarizer 152. The linearly polarized light is converted into left circularly polarized light through the retardation film 154. The converted left circularly polarized light passes through the optically isotropic barrier film 140 without retardation, is then reflected by the first electrode 124 and converted into right circularly polarized light. The converted right circularly polarized light is transmitted through the optically isotropic barrier film 140 without any retardation and is then incident upon the retardation film 154. The right circularly polarized light incident upon the retardation film 154 is converted into linearly polarized light perpendicular to the transmission axis of the linear polarizer 152 through the retardation film 154. The linearly polarized light which is converted to have a transmission axis perpendicular to the transmission axis of the linear polarizer 152 cannot pass through the linear polarizer 152. As such, the exterior light passes through the retardation film 154 having a λ/4 retardation twice and the polarization state thereof is thus varied at 90 degrees. Accordingly, since exterior light passing through the retardation film 154 twice is converted such that it has a transmission axis perpendicular to the transmission axis of the linear polarizer 152, it cannot be emitted to the outside through the linear polarizer 152 and visualization of exterior light can thus be prevented.

As such, the organic electroluminescent display panel according to the present invention can protect the substrate 101 provided with the light emitting cell using the optically isotropic barrier film 140 and thus realize flexibility and prevent visualization of exterior light.

Figure 5:
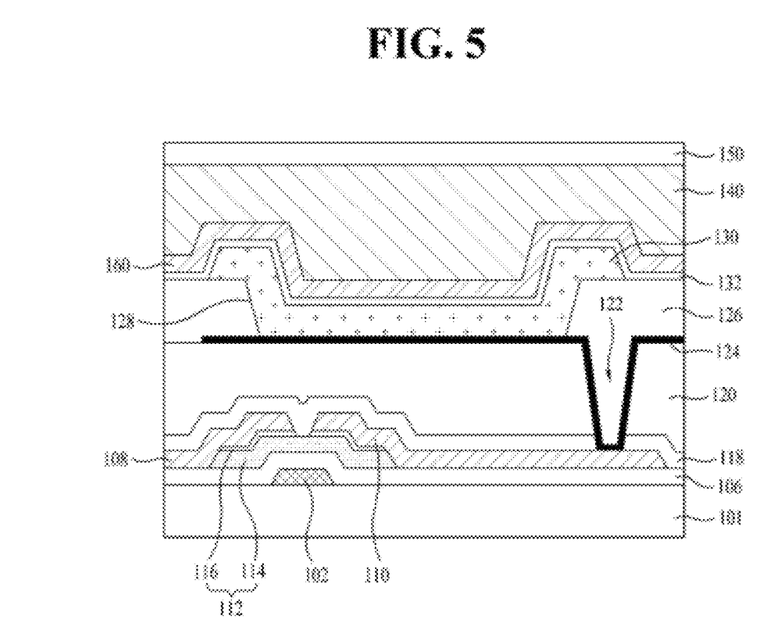
FIG. 5 is a sectional view illustrating an organic electroluminescent display panel according to another embodiment.

FIG. 5 is a cross-sectional view illustrating an organic electroluminescent display panel according to another embodiment of the present invention.

The organic electroluminescent display panel shown in FIG. 5 has the same elements as the organic electroluminescent display panel shown in FIG. 1 except that it further includes a barrier protective film 160 having a monolayer structure. Accordingly, a detailed description of the same elements will be omitted.

The barrier protective film 160 is formed between the lower adhesive 148 of the barrier film 140, and the second electrode 132. The barrier protective film 160 blocks permeation of exterior moisture, oxygen or heat, together with the barrier film 140 and thus improves reliability. Accordingly, although the barrier film 140 has a moisture permeability of $10^{-3}$ $g/m^2$ day or less, which is lower than conventional cases, the present invention can block permeation of exterior moisture or oxygen.

The barrier protective film 160 has a monolayer structure formed of aluminum oxide ($Al_xO_y$), silicon oxynitride ($SiON_x$), silicon oxide ($SiO_x$) or silicon nitride ($SiN_x$). The barrier protective film 160 has a thickness of 1 to 2 μm. When the barrier protective film 160 has a thickness lower than 1 μm, it is difficult to secure high temperature/high humidity reliability. In addition, when the barrier protective film 160 has a thickness higher than 2 μm, deposition time is lengthens, stress of the barrier protective film 160 increases, and the barrier protective film 160 may thus be cracked.

The barrier protective film 160 is formed on the substrate 101 provided with the light emitting cell. At this time, the barrier protective film 160 is formed on the substrate 101 provided with the light emitting cell by PECVD performed at a low temperature of 80 to 100 degrees to protect the light emitting organic layer 130 which is damaged at a temperature of 110 degrees or higher.

As such, in the organic electroluminescent display panel according to this embodiment of the present invention, the barrier film 140 as well as the barrier protective film 160 having a monolayer structure block permeation of exterior moisture or oxygen to improve reliability.

Figure 6:
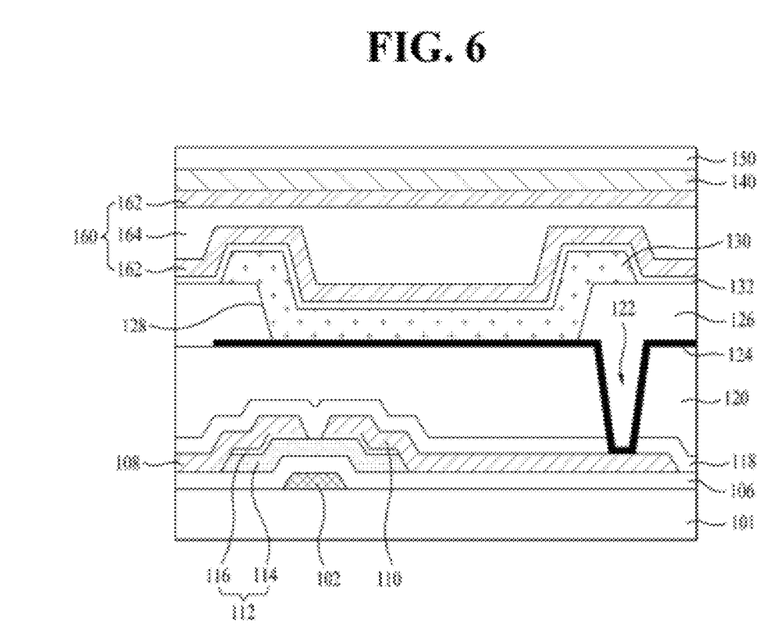
FIG. 6 is a sectional view illustrating an organic electroluminescent display panel according to another embodiment of the present invention.

FIG. 6 is a cross-sectional view illustrating an organic electroluminescent display panel according to another embodiment of the present invention.

The organic electroluminescent display panel shown in FIG. 6 has the same elements as the organic electroluminescent display panel shown in FIG. 1 except that it further includes a barrier protective film 160 having a multilayer structure. Accordingly, a detailed description of the same elements is omitted.

The barrier protective film 160 having a multilayer structure is formed between the lower adhesive 148 of the barrier film 140, and the second electrode 132. The barrier protective film 160 blocks permeation of exterior moisture, oxygen or heat, together with the barrier film 140 and thus improves reliability. Accordingly, although the barrier film 140 has moisture permeability of $10^{-3}$ g/m² day or less, which is lower than conventional cases, the present invention can block permeation of exterior moisture or oxygen. The barrier protective film 160 having a multilayer structure is formed by alternately laminating one or more inorganic barrier protective films 162 and one or more organic barrier protective films 164.

The inorganic barrier protective film 162 is formed to a thickness of 1 to 2 μm using a material such as aluminum oxide ($Al_xO_y$), silicon oxynitride ($SiON_x$), silicon oxide ($SiO_x$) or silicon nitride ($SiN_x$). The inorganic barrier protective film 162 blocks permeation of moisture or oxygen and exterior heat and thus improves reliability. The inorganic barrier protective film 162 is formed on the substrate 101 provided with the light emitting cell by PECVD performed at low temperature of 80 to 100 degrees to protect the light emitting organic layer 130 which is damaged at a temperature of 110 degrees or higher.

The organic barrier protective film 164 is formed to a thickness of 8 to 10 μm using a polymer material such as an acrylic resin, an epoxy resin, polyimide or polyethylene. The organic barrier protective film 164 offsets stress of the inorganic barrier protective film 162, and realizes flexibility and evenness. In particular, the organic barrier protective film 164 shields pores formed in the inorganic barrier protective film 162. Specifically, when the inorganic barrier protective film 162 is formed at a low temperature by deposition, unreacted substances are produced due to low active energy during the deposition process and particles are thus formed on the inorganic barrier protective film 162. When these particles are removed through a washing process, pores are formed on the inorganic barrier protective film 162 present in the area where the particles are removed. When the organic barrier protective film 164 is formed on the inorganic barrier protective film 162 in order to prevent permeation of moisture into these pores, pores of the inorganic barrier protective film 162 are shielded by the organic barrier protective film 164.

As such, in the organic electroluminescent display panel according to this embodiment of the present invention, the barrier film 140 as well as the barrier protective film 160 having a multilayer structure block permeation of exterior moisture or oxygen to improve reliability.

FIGS. 7A to 7G are cross-sectional views illustrating a method for the organic electroluminescent display panel according to the embodiments. Here, the organic electroluminescent display panel shown in FIG. 5 is illustrated by way of example.

Figure 7A:
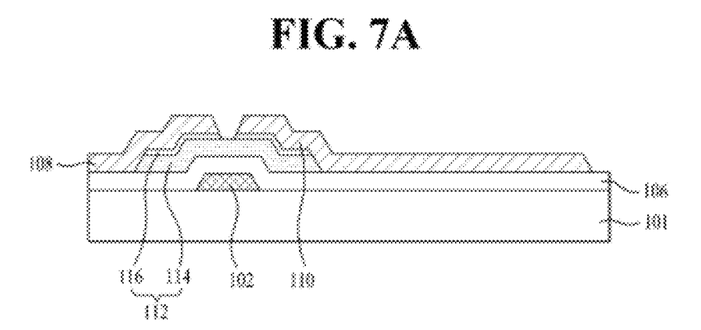
FIGS. 7A to 7G are sectional views illustrating a method for manufacturing the organic electroluminescent display panel according to the present invention.

Referring to FIG. 7A, a gate insulating film 106, a semiconductor pattern 112, a source electrode 108 and a drain electrode 110 are sequentially formed on a substrate 101.

Specifically, a gate metal layer is sequentially formed by a deposition method such as sputtering on the substrate 101. The gate metal layer is formed using a metal such as an aluminum-based metal (Al, AlNd), copper (Cu), titanium (Ti), molybdenum (Mo) and tungsten (W). Subsequently, the gate metal layer is patterned by photolithographic processes and etching processes to form a gate electrode 102.

Then, an inorganic insulating material such as silicon oxide ($SiO_x$) or silicon nitride ($SiN_x$) is formed over the entire surface of the substrate 101 provided with the gate electrode 102 to form a gate insulating film 106. Then, an amorphous silicon layer and an amorphous silicon layer in which an impurity (n+ or p+) is doped are sequentially formed the substrate 101 provided with the gate insulating film 106. Then, the amorphous silicon layer and the amorphous silicon layer in which an impurity (n+ or p+) are doped are patterned through photolithographic processes and etching processes to form a semiconductor pattern including an active layer 114 and an ohmic contact layer 116.

Then, a data metal layer is formed on the substrate 101 provided with the semiconductor pattern by a deposition method such as sputtering. The data metal layer is formed using a metal such as titanium (Ti), tungsten (W), aluminum (Al), molybdenum (Mo), and copper (Cu). Then, the data metal layer is patterned by photolithographic process and etching process to form a source electrode 108 and a drain electrode 110. Then, the ohmic contact layer 116 interposed between the source and drain electrodes 108 and 110 is removed using the source electrode 108 and drain electrode 110 as masks to expose the active layer 114.

As mentioned above, since the semiconductor pattern, and the source and drain electrodes 108 and 110 are separately formed, two masks are required to form the same. In addition, to reduce the number of masks, the semiconductor pattern, and the source and drain electrodes 108 and 110 are simultaneously formed by a single mask process using a diffraction or semitransparent mask.

Figure 7B:
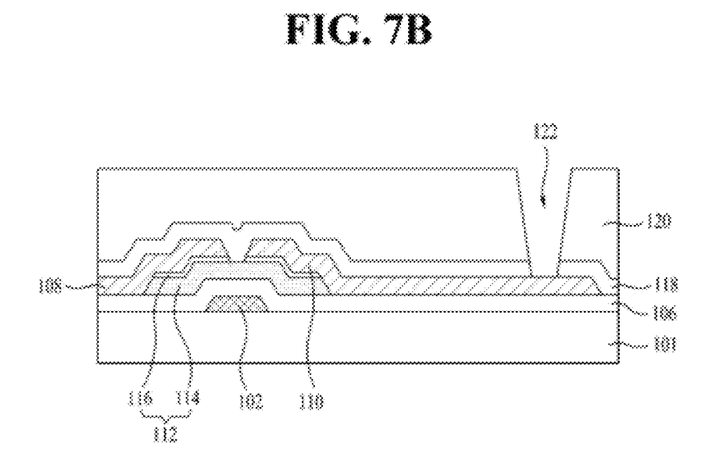

Referring to FIG. 7B, an inorganic protective film 118 and an organic protective film 120 including a pixel contact hole 122 are formed on the substrate 101 provided with the source and drain electrodes 108 and 110.

Specifically, an inorganic insulating material such as silicon oxide (SiOx) or silicon nitride (SiNx) is formed over the entire surface of the substrate 101 provided with the source and drain electrodes 108 and 110 to form an inorganic protective film 118. Then, an organic insulating material such as an acrylic resin is formed over the entire surface of the inorganic protective film 118 to form an organic protective film 120. Then, the inorganic protective film 118 and the organic protective film 120 are patterned through photolithographic processes and etching processes to form a pixel contact hole 122. The pixel contact hole 120 passes through the inorganic protective film 118 and the organic protective film 120 to expose the drain electrode 110.

Figure 7C:
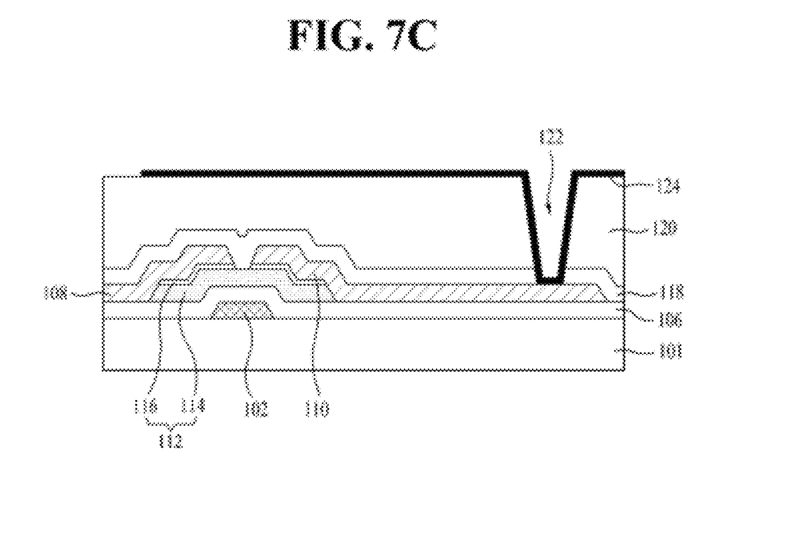

Referring to FIG. 7C, a first electrode 124 is formed on the substrate 101 provided with the organic protective film 120.

Specifically, a highly reflective non-transparent conductive layer is formed on the substrate 101 provided with the organic protective film 120 by a deposition method such as a sputtering method. Then, the non-transparent conductive layer is patterned through the photolithographic process and etching process to form a first electrode 124.

Figure 7D:
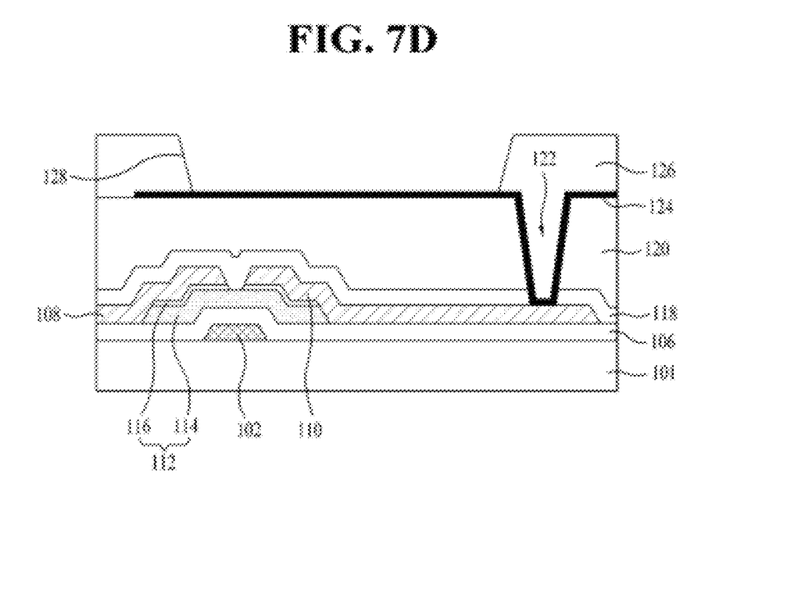

Referring to FIG. 7D, a bank insulating film 126 having a bank hole 128 is formed on the substrate 101 provided with the first electrode 124.

Specifically, an organic insulating material such as acrylic resin is formed over the entire surface of the substrate 101 provided with the first electrode 124 to form a bank insulating film 126. Then, the bank insulating film 126 is patterned through the photolithographic process and etching process to form a bank hole 128. The bank hole 128 passes through the bank insulating film 126 in each pixel region to expose the first electrode 124.

Figure 7E:
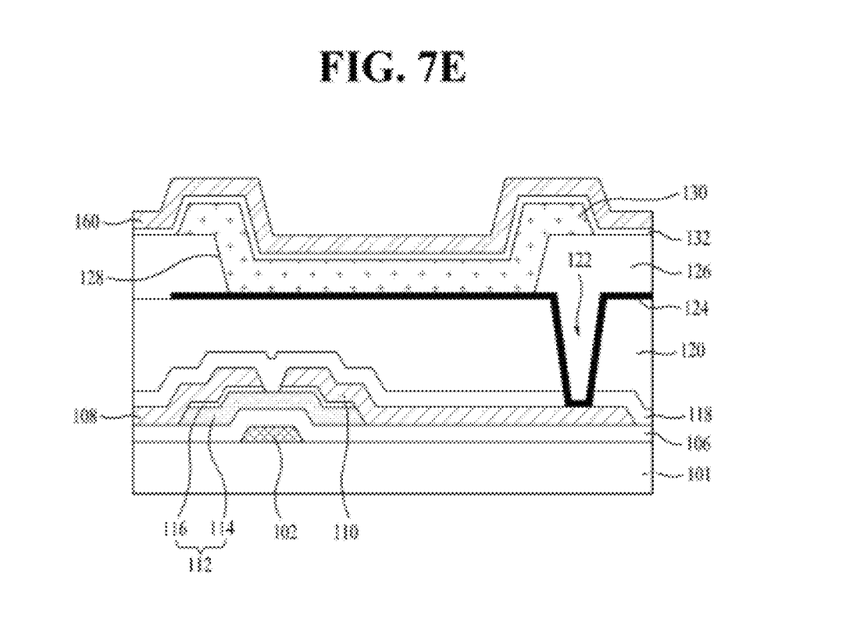

Referring to FIG. 7E, a light emitting organic layer 130, a second electrode 132 and a barrier protective layer 160 are sequentially formed on the substrate 101 provided with the bank insulating film 126.

Specifically, the light emitting organic layer 130 including electron-related layers, the light emitting layer and hole-related layers are sequentially formed on the first electrode 124 exposed by the bank insulating film 126 by a thermal deposition method, a sputtering method or a combination thereof.

Then, a transparent conductive film or a non-transparent conductive material is applied to the substrate 101 provided with the light emitting organic layer 130 to form a second electrode 132. The transparent conductive film is formed using indium tin oxide (ITO), tin oxide (TO), indium zinc oxide (IZO), $SnO_2$, amorphous-indium tin oxide (a-ITO) or the like. The non-transparent conductive film is formed to a thickness to transmit light using Mg:Ag, Al or the like.

Then, an inorganic insulating material such as silicon oxide (SiOx) or silicon nitride (SiNx) is formed over the entire surface of the substrate 101 provided with the second electrode 132 to form a barrier protective layer 160.

Figure 7F:
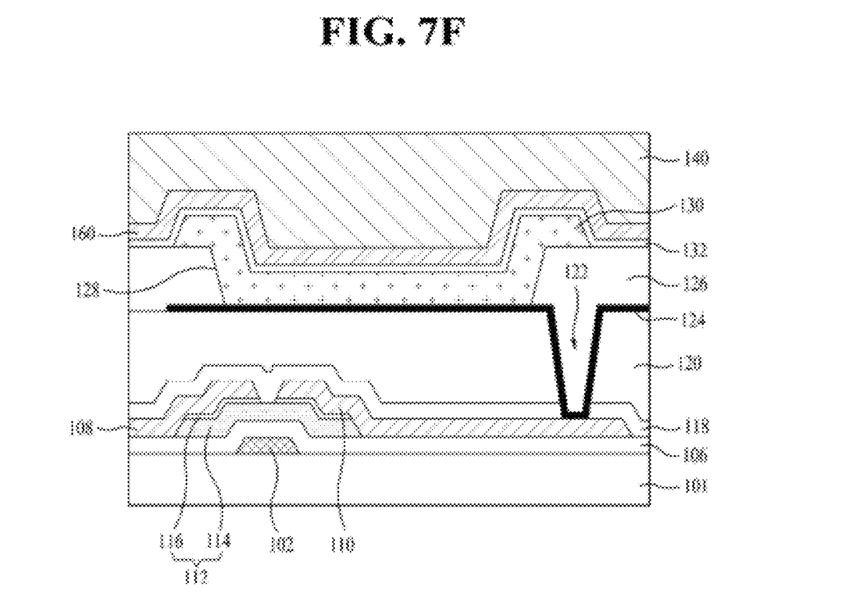

Referring to FIG. 7F, a barrier film 140 is adhered onto the barrier protective layer 160 by a lower adhesive.

Specifically, the separately prepared barrier film 140 is adhered to the barrier protective layer 160 through a thermal laminating process. At this time, the barrier film 140 is provided by forming a barrier layer on at least one of the front surface and the rear surface of the support film by an extrusion method excluding a stretching process or a solvent casting method excluding a stretching process.

Figure 7G:
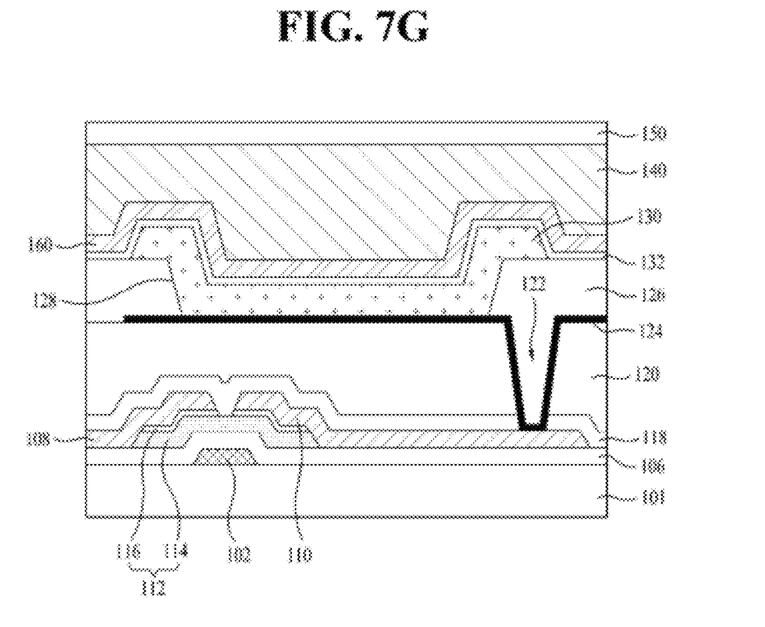

Referring to FIG. 7G, a separately prepared circular polarizer 150 is adhered to the barrier film 140 through an upper adhesive to complete the organic electroluminescent display panel.

Meanwhile, although the organic electroluminescent display panel according to the present invention having a structure in which the barrier film 140 arranged on the light emitting organic layer 130 is used as a water-permeating sealant has been described, the barrier film 140 may be arranged under the light emitting organic layer 130 and serve as a waterproofing material.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A plastic organic electroluminescent display device comprising:
   a light emitting cell including a first electrode, a light emitting organic layer and a second electrode formed on a substrate in this order;
   a barrier film adhered to the substrate provided with the light emitting cell, to seal the light emitting cell;
   a barrier protective film located between the barrier film and the second electrode; and
   a circular polarizer adhered onto the barrier film,
   wherein the barrier film includes:
     an optically isotropic support film having a mixture of glass fiber and a cyclic olefin copolymer (COC);
     a barrier layer having a multilayer structure, formed at at least one of a front surface and a rear surface of the optically isotropic support film;
     a lower adhesive adhered to the substrate provided with the light emitting cell; and
     an upper adhesive adhered to the circular polarizer;
   wherein the multilayer structure of the barrier layer includes an organic barrier layer composed entirely of organic materials, and an inorganic barrier layer,
   wherein the barrier protective film has a multilayer structure in which an organic barrier protective film and an inorganic barrier protective film are alternately laminated at least once,
   wherein the organic barrier protective film shields pores formed in the inorganic barrier protective film, and
   wherein the lower adhesive is a thermosetting or natural-setting type adhesive.

2. The device according to claim 1, wherein the optically isotropic support film has a retardation of 0 to 5 nm.

3. The device according to claim 1, wherein the organic barrier protective film is formed of a polymer material such as an acrylic resin, an epoxy resin, polyimide or polyethylene, and the inorganic barrier protective film is formed of aluminum oxide ($Al_xO_y$), silicon oxynitride ($SiON_x$), silicon oxide ($SiO_x$) or silicon nitride ($SiN_x$).

4. A method for manufacturing a plastic organic electroluminescent display panel comprising:
   sequentially forming a first electrode, a light emitting organic layer, and a second electrode on a substrate to form a light emitting cell;
   forming a barrier protective film on the second electrode,
   adhering a barrier film to the substrate provided with the light emitting cell and the barrier protective film to seal the light emitting cell through a thermal lamination process;
   adhering a circular polarizer to the barrier film; and
   wherein the barrier film includes an optically isotropic support film having a mixture of a glass fiber and a cyclic olefin copolymer (COC), a barrier layer having a multilayer structure, formed at least one of a front surface and a rear surface of the optically isotropic support film, a lower adhesive adhered to the substrate provided with the light emitting cell and the barrier protective film, and an upper adhesive adhered to the circular polarizer, wherein the multilayer structure of the barrier layer includes an organic barrier layer composed of entirely of organic materials, and an inorganic barrier layer, wherein the barrier protective film has a multilayer structure in which an organic barrier protective film and an inorganic barrier protective film are alternately laminated at least once, wherein the organic barrier protective film shields pores formed in the inorganic barrier protective film, and wherein the lower adhesive is a thermosetting or natural-setting type adhesive.

5. The method according to claim 4, wherein the optically isotropic support film has a retardation of 0 to 5 nm.

6. The method according to claim 4, wherein the organic barrier protective film is formed of a polymer material such as an acrylic resin, an epoxy resin, polyimide or polyethylene, and the inorganic barrier protective film is formed of aluminum oxide ($Al_xO_y$), silicon oxynitride ($SiON_x$), silicon oxide ($SiO_x$) or silicon nitride ($SiN_x$).

7. The device according to claim 1, wherein the organic barrier protective film is sandwiched between the inorganic barrier protective film and another inorganic barrier protective film.

8. The method according to claim 4, wherein the organic barrier protective film is sandwiched between the inorganic barrier protective film and another inorganic barrier protective film.

9. The device according to claim 1, wherein the barrier protective film is adhered to the barrier layer by the lower adhesive.

10. The method according to claim 4, wherein the barrier protective film is adhered to the barrier layer by the lower adhesive.

11. The device according to claim 1, wherein the optically isotropic support film has a substantially same coefficient of thermal expansion as the substrate.

12. The device according to claim 1, wherein the barrier film has a moisture permeability of $10^{-3}$ $g/m^2$/day or less.

13. The device according to claim 1, wherein the inorganic barrier protective film has a thickness of 1 to 2 μm.

14. The device according to claim 13, wherein the organic barrier protective film has a thickness of 8 to 10 μm.

15. The method according to claim 4, wherein the optically isotropic support film has a substantially same coefficient of thermal expansion as the substrate.

16. The method according to claim 7, wherein the barrier film has a moisture permeability of $10^{-3}$ $g/m^2$/day or less.

17. The method according to claim 4, wherein the inorganic barrier protective film has a thickness of 1 to 2 μm.

18. The method according to claim 17, wherein the organic barrier protective film has a thickness of 8 to 10 μm.

19. The device according to claim 1, further comprising a bank insulating film between the first electrode and the second electrode, and exposing the first electrode, wherein the barrier layer is formed on an entire surface of the at least one of a front surface and a rear surface of the optically isotropic support film to overlap an upper surface of the bank insulating film.

20. The method according to claim 4, wherein the sequentially forming includes forming a bank insulating film between the first electrode and the second electrode, and exposing the first electrode, and wherein the barrier layer is formed on an entire surface of the at least one of a front surface and a rear surface of the optically isotropic support film to overlap an upper surface of the bank insulating film.

* * * * *